United States Patent
Nakano et al.

(10) Patent No.: US 11,247,233 B2
(45) Date of Patent: Feb. 15, 2022

(54) VIBRATION PRESENTATION DEVICE

(71) Applicant: Sumitomo Riko Company Limited, Aichi (JP)

(72) Inventors: Katsuhiko Nakano, Aichi (JP); Takanori Murase, Aichi (JP); Hiroyuki Nakajima, Aichi (JP); Masaki Nasu, Aichi (JP)

(73) Assignee: Sumitomo Riko Company Limited, Aichi (JP)

(*) Notice: Subject to any disclaimer, the term of this patent is extended or adjusted under 35 U.S.C. 154(b) by 372 days.

(21) Appl. No.: 16/533,794

(22) Filed: Aug. 7, 2019

(65) Prior Publication Data

US 2019/0358672 A1 Nov. 28, 2019

Related U.S. Application Data

(63) Continuation of application No. PCT/JP2018/012104, filed on Mar. 26, 2018.

(30) Foreign Application Priority Data

Mar. 29, 2017 (JP) ............................. JP2017-065217

(51) Int. Cl.
*B06B 1/02* (2006.01)
*B06B 1/06* (2006.01)
*G06F 3/01* (2006.01)

(52) U.S. Cl.
CPC .......... *B06B 1/0253* (2013.01); *B06B 1/0292* (2013.01); *B06B 1/0611* (2013.01); *G06F 3/016* (2013.01)

(58) Field of Classification Search
CPC ..... B06B 1/0253; B06B 1/292; B06B 1/0611; G06F 3/016
(Continued)

(56) References Cited

U.S. PATENT DOCUMENTS

2010/0109486 A1 5/2010 Polyakov et al.
2011/0141046 A1 6/2011 Sato et al.
(Continued)

FOREIGN PATENT DOCUMENTS

JP S6310594 1/1988
JP 2005312230 11/2005
(Continued)

OTHER PUBLICATIONS

"Search Report of Europe Counterpart Application", dated Jan. 23, 2020, p. 1-p. 7.
(Continued)

*Primary Examiner* — Terrance L Kenerly
(74) *Attorney, Agent, or Firm* — JCIPRNET

(57) ABSTRACT

A vibration presentation device includes: an electrostatic or piezoelectric actuator; a first elastic body laminated on the actuator; a second elastic body laminated on the actuator on the opposite side to the first elastic body; an electrostatic or piezoelectric sensor disposed around the actuator; a cover that holds the first elastic body and the second elastic body such that the first elastic body and the second elastic body are compressed more than the actuator, the cover transmitting, when a pressing force in the laminate direction is applied to the cover from the outside, the pressing force to a sensor, and vibrating by vibration generated by the actuator; and a control device that drives the actuator when the sensor detects the pressing force.

13 Claims, 5 Drawing Sheets

(58) Field of Classification Search
USPC .......................................................... 310/309
See application file for complete search history.

(56) References Cited

U.S. PATENT DOCUMENTS

| | | |
|---|---|---|
| 2014/0368440 A1 | 12/2014 | Polyakov et al. |
| 2016/0011666 A1 | 1/2016 | Evreinov et al. |
| 2017/0285751 A1 | 10/2017 | Nakano et al. |
| 2019/0176192 A1 | 6/2019 | Nakano et al. |
| 2019/0181327 A1 | 6/2019 | Nakano et al. |

FOREIGN PATENT DOCUMENTS

| | | |
|---|---|---|
| JP | 2013519153 | 5/2013 |
| JP | 2014150600 | 8/2014 |
| JP | 2014519791 | 8/2014 |
| JP | 2016018420 | 2/2016 |
| WO | 2012173669 | 12/2012 |

OTHER PUBLICATIONS

"International Search Report (Form PCT/ISA/210) of PCT/JP2018/012104," dated May 1, 2018, with English translation thereof, pp. 1-3.

VIBRATION PRESENTATION DEVICE

CROSS-REFERENCE TO RELATED APPLICATIONS

This application is a continuation application of International Application number PCT/JP2018/012104, filed on Mar. 26, 2018, which claims the priority benefit of Japan Patent Application No. 2017-065217, filed on Mar. 29, 2017. The entirety of each of the above-mentioned patent applications is hereby incorporated by reference herein and made a part of this specification

BACKGROUND

Technical Field

The disclosure relates to a vibration presentation device.

Description of Related Art

As devices that present (generate) vibration, there are devices that apply tactile vibration to people, devices that apply vibration with anti-phases to structures for vibration control of the structures, and the like. For example, electrostatic actuators using elastomers are disclosed as actuators that present vibration. A device disclosed in Published Japanese Translation No. 2013-519153 of the PCT International Publication (FIGS. 2A to 2C) is a device that presents tactile vibration and includes an electroactive polymer actuator in which two or more cartridges (electrostatic actuators) formed by a pair of electrodes and a dielectric body between the pair of the electrodes are laminated and a mass fixed to the electroactive polymer actuator. A device disclosed in Published Japanese Translation No. 2014-519791 of the PCT International Publication (FIGS. 6 to 8) includes an electrostatic type of electroactive polymer actuator and a mass fixed to this actuator and generates mechanical vibration with an audible frequency range.

A vibration presentation device disclosed in Japanese Laid-Open No. 2016-18420 (claims 3, [0022], and [0025]) includes a pouch formed of a transparent sheet, a material similar to a liquid or gel that is sealed inside the pouch and transmits a pressing force, and an actuator that generates a tactile signal so that the tactile signal is transmitted to the inside of the transparent sheet or the material similar to gel. As the actuator, for example, a magnetostriction or multi-layer piezoelectric actuator is exemplified. The vibration presentation device disclosed in Japanese Laid-Open No. 2016-18420 includes a sensor, as disclosed, and drives an actuator based on a detection result from the sensor. Here, the sensor detects by using, for example, optics, heat, a piezoelectric sound, electromagnetism, or the like, as disclosed.

Japanese Laid-Open No. 2014-150600 discloses an actuator in which a plurality of electrode covering bodies are alternately shifted and laminated in individual layers. Thus, creeping discharge between electrodes is considered to be prevented. An electrode layer included in each electrode covering body is connected to a power supply electrode. Japanese Laid-Open No. S63-10594 and Japanese Laid-Open No. 2005-312230 disclose devices using piezoelectric elements. In the device disclosed in Japanese Laid-Open No. S63-10594, multiple layers of piezoelectric elements in which electrode thin films are formed on the upper and lower surfaces are laminated by alternately reversing the upper and lower surfaces and a side surface electrode is formed to commonly connect each electrode thin film respectively. In the device disclosed in Japanese Laid-Open No. 2005-312230, a configuration in which connection electrodes are respectively disposed on both end surfaces of a roll body is disclosed.

However, the amplitude of vibration in only an electrostatic actuator and a piezoelectric actuator used as a single body is small. Accordingly, the amplitude of vibration is required to be large without an increase in size. Further, when a pressing force is received from the outside, the actuator is required to be driven immediately.

SUMMARY

The disclosure provides a vibration presentation device capable of presenting large vibration without an increase in size while adopting a structure including an actuator and a sensor that detects a pressing force.

(1. First Vibration Presentation Device)

According to the disclosure, a first vibration presentation device includes: an electrostatic or piezoelectric actuator that includes a first electrode sheet, a second electrode sheet, and a dielectric sheet or a piezoelectric sheet disposed between the first electrode sheet and the second electrode sheet; a first elastic body laminated on the actuator; a second elastic body laminated on the actuator on the opposite side to the first elastic body; an electrostatic or piezoelectric sensor disposed around the actuator; a cover that holds the first elastic body and the second elastic body such that an actuator laminate formed by the actuator, the first elastic body, and the second elastic body is compressed in a laminate direction and the first elastic body and the second elastic body are compressed more than the actuator and that transmits, when a pressing pressure in the laminate direction is applied to the cover from the outside, the pressing force to the sensor and vibrates by vibration generated by the actuator; and a control device that drives the actuator when the sensor detects the pressing force.

(2. Second Vibration Presentation Device)

According to the disclosure, a second vibration presentation device includes: an electrostatic or piezoelectric transducer that includes a first electrode sheet, a second electrode sheet, and a dielectric sheet or a piezoelectric sheet disposed between the first electrode sheet and the second electrode sheet and functions as a sensor and an actuator; a first elastic body laminated on the transducer; a second elastic body laminated on the transducer on an opposite side to the first elastic body; a cover that holds the first elastic body and the second elastic body such that a transducer laminate formed by the transducer, the first elastic body, and the second elastic body is compressed in a laminate direction and the first elastic body and the second elastic body are compressed more than the transducer and that transmits, when a pressing pressure in the laminate direction is applied to the cover from the outside, the pressing force to the transducer; and a control device that drives the transducer as an actuator and transmits vibration to the cover after the transducer serving as the sensor detects the pressing force.

DESCRIPTION OF THE EMBODIMENTS

Figure 1:
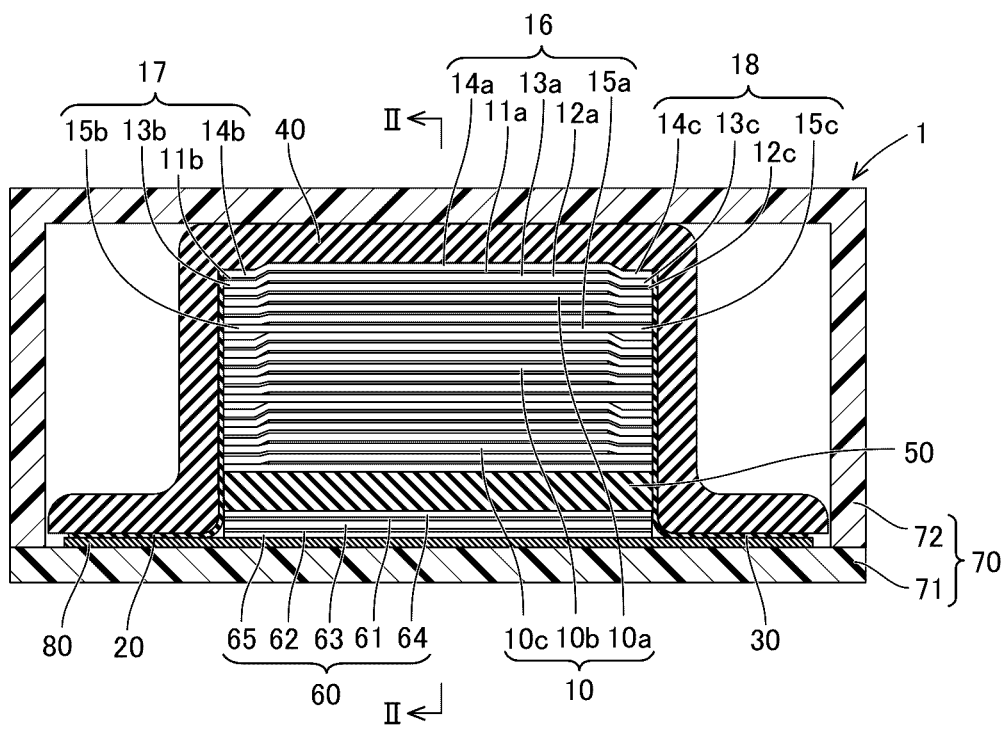
FIG. 1 is a sectional view illustrating a vibration presentation device 1 according to a first embodiment.

As described above, in the state in which the actuator laminate is compressed by the cover, the first elastic body and the second elastic body disposed on both sides of the actuator are compressed more than the actuator. Therefore, even when the actuator laminate is compressed by the cover, there is no influence on a stretching operation of the actuator. Then, when a voltage is applied to the first electrode sheet and the second electrode sheet of the actuator, the actuator stretches in the thickness direction. Displacement of the actuator generated through the stretching operation of the actuator is transmitted to the cover via the first elastic body or the second elastic body. Further, an elastic deformation force of the first elastic body and the second elastic body is changed through the stretching operation of the actuator and the change in the elastic deformation force of the first elastic body and the second elastic body is transmitted to the cover. Accordingly, in an initial state, the first elastic body and the second elastic body are compressed by the cover, and thus vibration is efficiently applied to the cover. That is, even when slight vibration is generated in the single actuator, large vibration can be applied to the cover.

Further, the vibration presentation device includes a sensor and a control device. The sensor is disposed around the actuator inside the cover and detects a pressing force applied to the cover. Then, the control device drives the actuator when the sensor detects that a pressing force is applied. For example, when a pressing force is applied to the cover by a human finger, the sensor detects the pressing force and the actuator is subsequently driven. Then, vibration can be presented to the human finger which has applied the pressing force to the cover. That is, the sensor and the actuator are disposed inside the cover and the sensor is disposed around the actuator, and thus responsiveness from the detection of the pressing force to the presentation of the vibration is considerably satisfactory. Accordingly, the vibration presentation device includes the actuator and the sensor detecting the pressing force, and thus can present large vibration without an increase in size.

As described above, in the state in which the transducer laminate is compressed by the cover, the first elastic body and the second elastic body disposed on both sides of the transducer are compressed more than the transducer. Therefore, even when the transducer laminate is compressed by the cover, there is no influence on a stretching operation of the transducer.

Then, when a voltage is applied to the first electrode sheet and the second electrode sheet of the transducer, the transducer functions as the actuator and stretches in the thickness direction. Displacement of the transducer generated through the stretching operation of the transducer is transmitted to the cover via the first elastic body or the second elastic body. Further, an elastic deformation force of the first elastic body and the second elastic body is changed through the stretching operation of the transducer and the change in the elastic deformation force of the first elastic body and the second elastic body is transmitted to the cover. Accordingly, in an initial state, the first elastic body and the second elastic body are compressed by the cover, and thus vibration is efficiently applied to the cover. That is, even when slight vibration is generated in the single transducer, large vibration can be applied to the cover.

Further, the transducer functions as an actuator and functions as a sensor. The transducer is disposed inside the cover and detects a pressing force applied to the cover. The vibration presentation device further includes a control device.

When the transducer serving as the sensor detects that the pressing force is applied, the control device drives the transducer serving as the actuator. For example, when a pressing force is applied to the cover by a human finger, the transducer serving as the sensor detects the pressing force and the transducer serving as the actuator is subsequently driven. Then, vibration can be presented to the human finger which has applied the pressing force to the cover. That is, the transducer serves as both the sensor and the actuator and is disposed inside the cover, and thus responsiveness from the detection of the pressing force to the presentation of the vibration is considerably satisfactory. Accordingly, the vibration presentation device includes the actuator and the sensor detecting the pressing force, and thus can present large vibration without an increase in size.

1. First Embodiment 1-1. Overview of Vibration Presentation Device 1

A vibration presentation device 1 detects a pressing force from the outside and presents vibration. That is, the vibration presentation device 1 has a function of a sensor and a function of an actuator. For example, when a pressing force is applied by a human finger or the like, and the vibration presentation device 1 detects the pressing force and subsequently presents tactile vibration to the finger.

For example, when the vibration presentation device 1 is mounted on an operation panel or the like and an operator touches the operation panel, the vibration presentation device 1 detects a pressing force associated with the touch and transmits vibration to the operator. For example, when the operation panel includes an operation button, the vibration presentation device 1 is disposed in an operation button so that a touch on the operation button by the operator can be transmitted to the operator without the operator viewing the operation panel. Further, when the operation panel includes a plurality of operation buttons, the vibration presentation device 1 is disposed in each operation button and each vibration presentation device 1 generates different vibration so that the operator can recognize which operation button the operator touches.

1-2. Configuration of Vibration Presentation Device 1

Figure 2:
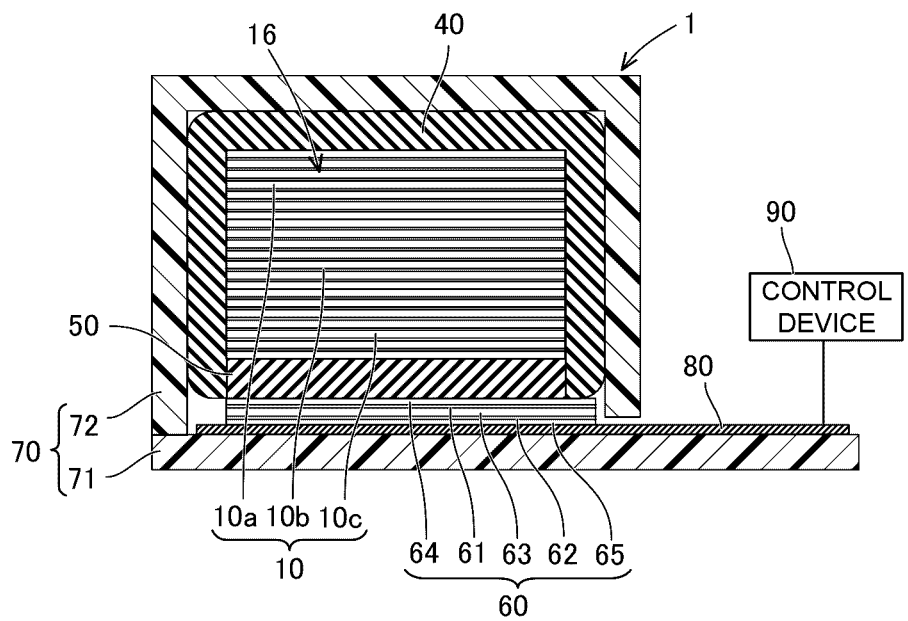
FIG. 2 is a sectional view taken along the line II-II of FIG. 1.
Figure 3:
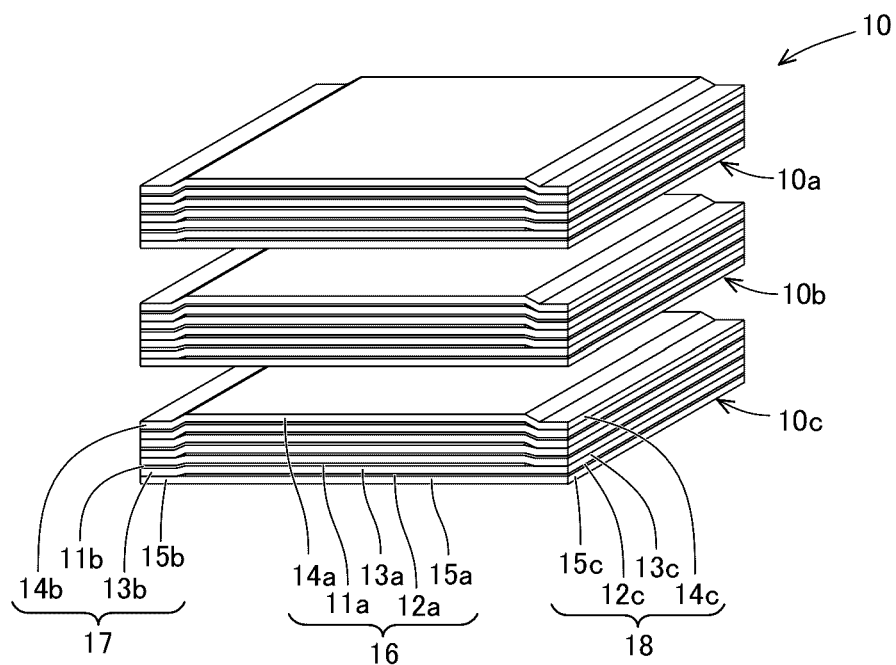
FIG. 3 is an exploded perspective view illustrating three actuator units 10a, 10b, and 10c.

A configuration of the vibration presentation device 1 will be described with reference to FIGS. 1 to 5. Here, FIGS. 1 to 3 illustrate the thickness of each member in an exaggerated manner in order to facilitate understanding. Therefore, the thickness of the vibration presentation device 1 in the vertical direction of FIGS. 1 and 2 is actually formed to be considerably thin.

As illustrated in FIGS. 1 and 2, the vibration presentation device 1 includes an actuator 10, a first conductive part 20, a second conducive part 30, a first elastic body 40, a second elastic body 50, a sensor 60, a cover 70, a conductive wire 80, and a control device 90.

The actuator 10 is an electrostatic actuator or a piezoelectric actuator. In the case of an electrostatic actuator, the actuator 10 includes a first electrode sheet 11, a second electrode sheet 12, and a dielectric sheet 13. On the other hand, in the case of a piezoelectric actuator, the actuator 10 includes the first electrode sheet 11, the second electrode sheet 12, and the piezoelectric sheet 13.

Here, the actuator 10 includes a plurality of actuator units 10a, 10b, and 10c. In the embodiment, as illustrated in FIG. 3, the actuator 10 includes the three actuator units 10a, 10b, and 10c. The three actuator units 10a, 10b, and 10c are laminated. Here, the actuator 10 may include only one actuator unit 10a.

Each of the actuator units 10a, 10b, and 10c is formed in a substantially planar shape (equivalent to a flat shape). The external form of each of the actuator units 10a, 10b, and 10c is formed in a rectangular shape in a top view of FIG. 3 (when viewed in a plane-normal direction). Each of the actuator units 10a, 10b, and 10c is formed of a soft material that has flexibility and is stretchable.

Figure 4:
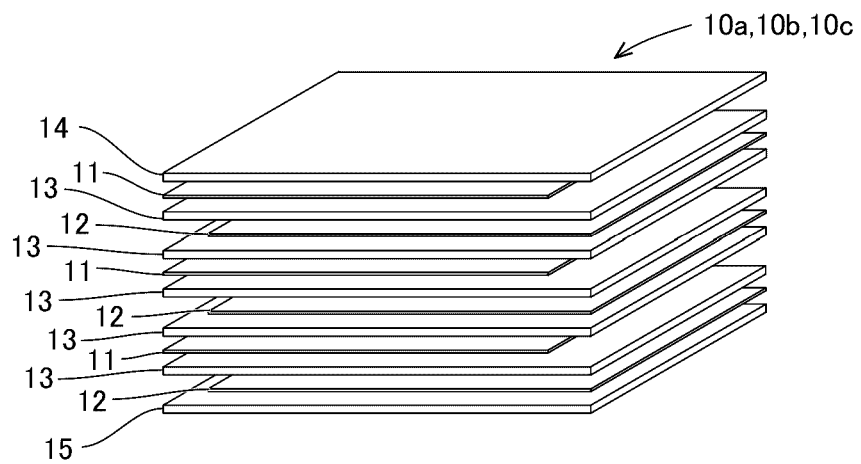
FIG. 4 is an exploded perspective view illustrating the individual actuator units 10a, 10b, and 10c.

As illustrated in FIG. 4, each of the actuator units 10a, 10b, and 10c includes a plurality of first electrode sheets 11, a plurality of second electrode sheets 12, a plurality of dielectric sheets 13 or a plurality of piezoelectric sheets 13, a first protective sheet 14, and a second protective sheet 15 and is a member in which these sheets are joined to be integrated. The actuator units 10a, 10b, and 10c are mutually separate members.

First, each of the constituent members 11 to 15 of the actuator units 10a, 10b, and 10c will be described with reference to FIG. 4. The plurality of first electrode sheets 11 and the plurality of second electrode sheets 12 are formed in a sheet shape of a material which has flexibility and is stretchable. For example, the first electrode sheet 11 and the second electrode sheet 12 are molded by mixing conductive fillers in an elastomer. The first electrode sheet 11 and the second electrode sheet 12 may be formed of an elastomer or a conductive fabric in a sheet shape. The first electrode sheet 11 and the second electrode sheet 12 are formed in the same shape and formed of the same material, and the first electrode sheet 11 and the second electrode sheet 12 are formed in a rectangular shape of a thin film.

The plurality of dielectric sheets 13 or the plurality of piezoelectric sheets 13 are formed of a dielectric or piezoelectric material that is elastically deformable. The dielectric sheet 13 or the piezoelectric sheet 13 is formed in a rectangular shape of a thin film. The width of the dielectric sheet 13 or the piezoelectric sheet 13 in a lateral direction is substantially the same as the width of the first electrode sheet 11 and the second electrode sheet 12 in the lateral direction. On the other hand, the length of the dielectric sheet 13 or the piezoelectric sheet 13 in the longitudinal direction is longer than the length of the first electrode sheet 11 and the second electrode sheet 12 in the longitudinal direction. The thickness of the dielectric sheets 13 or the piezoelectric sheets 13 is thicker than that of the first electrode sheet 11 and the second electrode sheet 12.

Further, the dielectric sheets 13 or the piezoelectric sheets 13 have a structure that stretches in the thickness direction and stretches in the planar direction with the stretch in the thickness direction. The dielectric sheets 13 or the piezoelectric sheets 13 stretch in the thickness direction and the planar direction in accordance with a voltage applied to the first electrode sheet 11 and the second electrode sheet 12.

A material that has insulation is applied to the first protective sheet 14 and the second protective sheet 15. In the embodiment, the first protective sheet 14 and the second protective sheet 15 are formed of the same material and in the same shape of the dielectric sheet 13. That is, the first protective sheet 14 and the second protective sheet 15 are formed of an elastomer and in a rectangular shape.

As illustrated in FIG. 4, in the actuator units 10a, 10b, and 10c, the first electrode sheet 11, the dielectric sheet 13 or the piezoelectric sheet 13, the second electrode sheet 12, the dielectric sheets 13 or the piezoelectric sheets 13, and the first electrode sheet 11 are laminated in this order. That is, the plurality of first electrode sheets 11 and the plurality of second electrode sheets 12 are alternately laminated, and the dielectric sheets 13 or the piezoelectric sheets 13 are disposed between the first electrode sheet 11 and the second electrode sheet 12.

The first electrode sheet 11 and the second electrode sheet 12 are offset to the right and left (in the longitudinal direction) of FIG. 4. Specifically, some of the first electrode sheets 11 and some of the second electrode sheets 12 are disposed to face each other. Some of the rest of the first electrode sheets 11 and some of the second electrode sheets 12 which do not face each other are located on the opposite sides, setting the facing portions as references.

That is, in FIG. 4, in the middle in the right and left directions, the first electrode sheets 11 and the second electrode sheets 12 face each other. The first electrode sheets 11 are on the left where there are no second electrode sheets 12. The second electrode sheets 12 are on the right where there are no first electrode sheets 11.

The length of the dielectric sheets 13 or the piezoelectric sheets 13 in the longitudinal direction (the width in the right and left directions of FIG. 4) is a length of the facing portion in all of the range in which the first electrode sheets 11 and the second electrode sheets 12 face each other, a range in which there are only the first electrode sheets 11, and a range in which there are only the second electrode sheets 12.

The first protective sheet 14 covers the entire surface of one (the uppermost layer in FIG. 4) of the outermost layers of the plurality of the first electrode sheets 11 and the plurality of the second electrode sheets 12. The second protective sheet 15 covers the entire surface of the other (lowermost layer in FIG. 4) of the outermost layers of the plurality of the first electrode sheets 11 and the plurality of the second electrode sheets 12.

Next, each of the actuator units 10a, 10b, and 10c will be described with reference to FIG. 3. Each of the actuator units 10a, 10b, and 10c includes an actuator main body 16 located in the middle in the right and left directions of FIG. 3, a first terminal 17 located on the left in FIG. 3, and a second terminal 18 located on the right in FIG. 3. The first terminal 17 is a terminal of a positive potential in the actuator main body 16 and the second terminal 18 is a terminal of a ground potential in the actuator main body 16. Here, the first terminal 17 and the second terminal 18 extend on the opposite side, setting the actuator main body 16 as a reference.

Here, the first electrode sheet 11 includes a first counter electrode part 11a located in the middle in the right and left directions and a first terminal electrode part 11b extending from the first counter electrode part 11a. The second electrode sheet 12 includes a second counter electrode part 12a located in the middle in the right and left directions and a second terminal electrode part 12c extending from the second counter electrode part 12a. The first counter electrode part 11a faces the second counter electrode part 12a. A direction in which the first terminal electrode part 11b extends from the first counter electrode part 11a is opposite to a direction in which the second terminal electrode part 12c extends from the second counter electrode part 12a.

The dielectric sheets 13 or the piezoelectric sheets 13 include a dielectric main body 13a or a piezoelectric main body 13a, a first extension part 13b, and a second extension part 13c. The dielectric main body 13a or the piezoelectric main body 13a is interposed between the first counter electrode part 11a and the second counter electrode part 12a. The first extension part 13b extends from the dielectric main body 13a or the piezoelectric main body 13a and is interposed between the plurality of first terminal electrodes parts 11b. The second extension part 13c extends from the dielectric main body 13a or the piezoelectric main body 13a and is interposed between the plurality of second terminal electrode parts 12c.

In this way, by causing the first extension part 13b which is a part of the dielectric sheets 13 or the piezoelectric sheets 13 to be outside of the actuator main body 16 without causing only the first terminal electrode part 11b to be outside of the actuator main body 16, the first terminal electrode part 11b and the first extension part 13b are laminated. Accordingly, a sum thickness of the first terminal electrode part 11b and the first extension part 13b is assumed to be thinner than that of the actuator main body 16 by the thickness of the second electrode sheet 12. Therefore, it is possible to prevent a large deformation force from occurring near the boundary between the first terminal electrode part 11b and the first counter electrode part 11a. As a result, a constituent region of a conductive path connected to the first counter electrode part 11a can have high durability. The same applies to the second terminal electrode part 12c.

Further, the first protective sheet 14 includes a first protective main body 14a, a first protective-first terminal protective part 14b, and a first protective-second terminal protective part 14c. The first protective main body 14a covers the first counter electrode part 11a located in one (the upper side of FIG. 3) of the outermost layers. The first protective-first terminal protective part 14b covers the first terminal electrode part 11b located in one of the outermost layers. The first protective-second terminal protective part 14c covers the second terminal electrode part 12c located in one of the outermost layers.

The second protective sheet 15 includes a second protective main body 15a, a second protective-first terminal protective part 15b, and a second protective-second terminal protective part 15c. The second protective main body 15a covers the first counter electrode part 11a located in the other (the lower side of FIG. 3) of the outermost layers. The second protective-first terminal protective part 15b covers the first terminal electrode part 11b located in the other of the outermost layers. The second protective-second terminal protective part 15c covers the second terminal electrode part 12c located in the other of the outermost layers.

That is, the actuator main body 16 is formed in a planar shape by the plurality of first counter electrode parts 11a, the plurality of second counter electrode parts 12a, the plurality of dielectric main bodies 13a or the plurality of piezoelectric main bodies 13a, the first protective main body 14a, and the second protective main body 15a. The first terminal 17 is formed in a planar shape by the plurality of first terminal electrode parts 11b, the plurality of first extension parts 13b, the first protective-first terminal protective part 14b, and the second protective-first terminal protective part 15b. The first terminal 17 extends in the planar direction of the planar shape of the actuator main body 16. The second terminal 18 is formed in a planar shape by the plurality of second terminal electrode parts 12c, the plurality of second extension parts 13c, the first protective-second terminal protective part 14c, and the second protective-second terminal protective part 15c. The second terminal 18 extends in the planar direction of the planar shape of the actuator main body 16.

As illustrated in FIGS. 1 and 2, the first conductive part 20 is formed of a material capable of being elastically deformed (for example, an elastomer) in a sheet shape and is formed to be bent in an L shape. The first conductive part 20 is molded by mixing conductive fillers in the elastomer as in the first electrode sheet 11. Here, the thickness of the first conductive part 20 is thicker than that of the first electrode sheet 11.

One side of the L shape of the first conductive part 20 is formed in a direction intersecting (for example, orthogonal to) the surface with the planar shape of the actuator main body 16. Then, the one side of the L shape of the first conductive part 20 comes into contact with an end surface of the first terminal 17. Specifically, the one side of the L shape of the first conductive part 20 comes into contact with an end of the first terminal electrode part 11b and an end of the first extension part 13b. Accordingly, the first conductive part 20 is electrically connected to ends of the plurality of first terminal electrode parts 11b.

The other side of the L shape of the first conductive part 20 extends away from the actuator main body 16 and is formed to be parallel to the planar direction of the planar shape of the actuator main body 16. The other side of the L shape of the first conductive part 20 is electrically connected to the conductive wire 80 to be described below.

The second conductive part 30 is formed of a material capable of being elastically deformed (for example, an elastomer) in a sheet shape and is formed to be bent in an L shape as in the first conductive part 20. The second conductive part 30 is molded by mixing conductive fillers in the elastomer.

One side of the L shape of the second conductive part 30 is formed in the direction intersecting (for example, orthogonal to) the surface with the planar shape of the actuator main body 16. Then, the one side of the L shape of the second conductive part 30 comes into contact with an end surface of the second terminal 18. Specifically, the one side of the L shape of the second conductive part 30 comes into contact with an end of the second terminal electrode part 12c and an end of the second extension part 13c. Accordingly, the second conductive part 30 is electrically connected to ends of the plurality of second terminal electrode parts 12c.

The other side of the L shape of the second conductive part 30 extends away from the actuator main body 16 and is formed to be parallel to the planar direction of the planar shape of the actuator main body 16. The other side of the L shape of the second conductive part 30 is electrically connected to the conductive wire 80 to be described below.

The first conductive part 20 can easily form a conductive path between the plurality of first terminal electrode parts 11b. Similarly, the second conductive part 30 can easily form a conductive path between the plurality of second terminal electrode parts 12c. Since the first conductive part 20 and the second conductive part 30 can be elastically deformed, the first conductive part 20 and the second conductive part 30 can follow deformation of the first terminal 17 and the second terminal 18. Accordingly, even when the first terminal 17 and the second terminal 18 are deformed, a conductive path can easily be formed between the first terminal electrode parts 11b and the second terminal electrode parts 12c.

The first elastic body 40 is disposed to come into contact with one surface (the upper surface of FIG. 1) of the planar shape of the actuator main body 16. The second elastic body 50 is disposed to come into contact with the other surface (the lower surface of FIG. 1) of the planar shape of the actuator main body 16, that is, the opposite side to the first elastic body 40 of the actuator main body 16. That is, the first elastic body 40 and the second elastic body 50 are respectively disposed on both end surfaces (the upper and lower surfaces of FIG. 1) facing in the plane-orthogonal direction of the planar shape of the actuator main body 16.

Further, as illustrated in FIG. 2, the first elastic body 40 is disposed to come into contact with both end surfaces facing in the planar direction of the planar shape of the actuator main body 16 (surfaces on which the first terminal 17 and the second terminal 18 do not exist (the right and left surfaces of FIG. 2)). Further, as illustrated in FIG. 1, the first elastic body 40 is disposed to come into contact with one surface (the upper surface of FIG. 1) of the planar shape of the first terminal 17 and one surface (the upper surface of FIG. 1) of the planar shape of the second terminal 18. The second elastic body 50 is disposed to come into contact with the other surface (the lower surface of FIG. 1) of the planar shape of the first terminal 17 and the other surface (the lower surface of FIG. 1) of the planar shape of the second terminal 18. Further, the first elastic body 40 is disposed to come into contact with the entire outer surface of the L shape of the first conductive part 20 and the entire outer surface of the L shape of the second conductive part 30.

For the first elastic body 40 and the second elastic body 50, materials that have small elastic moduli $E_{(40)}$ and $E_{(50)}$ and small loss factors $\tan \delta_{(40)}$ and $\tan \delta_{(50)}$ are used. In other words, for the first elastic body 40 and the second elastic body 50, materials that are soft and have a low attenuation nature are suitable. In particular, the first elastic body 40 and the second elastic body 50 have the elastic moduli $E_{(40)}$ and $E_{(50)}$ less than an elastic modulus $E2_{(16)}$ in the laminate direction (the plane-orthogonal direction of the planar shape) of the actuator main body 16. Further, the elastic modulus $E_{(40)}$ of the first elastic body 40 is less than an elastic modulus $E2_{(16)}$ in the planar direction of the actuator main body 16.

Specifically, a ratio of the elastic modulus $E_{(40)}$ of the first elastic body 40 to the elastic modulus $E1_{(16)}$ in the laminate direction of the actuator main body 16 is equal to or less than 15%. A ratio of the elastic modulus $E_{(50)}$ of the second elastic body 50 to the elastic modulus $E1_{(16)}$ in the laminate direction of the actuator main body 16 is equal to or less than 15%. These ratios are preferably equal to or less than 10%. Similarly, a ratio of the elastic modulus $E_{(40)}$ of the first elastic body 40 to the elastic modulus $E2_{(16)}$ in the planar direction of the actuator main body 16 is equal to or less than 15%. A ratio of the elastic modulus $E_{(50)}$ of the second elastic body 50 to the elastic modulus $E2_{(16)}$ in the planar direction of the actuator main body 16 is equal to or less than 15%. These ratios are preferably equal to or less than 10%.

Further, the first elastic body 40 and the second elastic body 50 have loss factors $\tan \delta_{(40)}$ and $\tan \delta_{(50)}$ equal to or less than a loss factor $\tan \delta_{(16)}$ of the actuator main body 16 under a predetermined condition. The predetermined condition means a use environment in which a temperature is in the range of −10 to 50° C. and a vibration frequency is equal to or less than 300 Hz.

As a material that satisfies the foregoing conditions, for example, silicone rubber is suitable for the first elastic body 40 and the second elastic body 50. For example, since urethane rubber has a better attenuation nature than silicone rubber, the urethane rubber is less suitable for the first elastic body 40 and the second elastic body 50 than the silicone rubber. Here, depending on an objective nature, urethane rubber can also be used for the first elastic body 40 and the second elastic body 50.

The sensor 60 is an electrostatic sensor or a piezoelectric sensor and is formed in a sheet shape. The sensor 60 is disposed around the actuator 10. In the embodiment, the sensor 60 is laminated on the actuator laminate (10, 40, 50) formed by the actuator 10, the first elastic body 40, and the second elastic body 50. In particular, the sensor 60 is laminated on the second elastic body 50 on the opposite side to the actuator 10. When the actuator 10 is of an electrostatic type, the sensor 60 may be of either an electrostatic type or a piezoelectric type. When the actuator 10 is of a piezoelectric type, the sensor 60 may be of either an electrostatic type or a piezoelectric type.

In the case of the electrostatic type, the sensor 60 includes a first sensor electrode sheet 61, a second sensor electrode sheet 62, and a sensor dielectric sheet 63 disposed between the first sensor electrode sheet 61 and the second sensor electrode sheet 62. Further, the sensor 60 includes a first sensor protective sheet 64 covering the outer surface of the first sensor electrode sheet 61 and a second sensor protective sheet 65 covering the outer surface of the second sensor electrode sheet 62. When a pressing force in the plane-normal direction is applied to the sensor 60, the sensor dielectric sheet 63 is compressed in the thickness direction. As a result, a distance between the first sensor electrode sheet 61 and the second sensor electrode sheet 62 varies, and electrostatic capacitance between electrodes varies. That is, the sensor 60 can output electrostatic capacitance in accordance with the pressing force.

In the case of the piezoelectric type, the sensor 60 includes the first sensor electrode sheet 61, the second sensor electrode sheet 62, and the sensor piezoelectric sheet 63 disposed between the first sensor electrode sheet 61 and the second sensor electrode sheet 62. In this case, when a pressing force in the plane-normal direction is applied to the sensor 60, the sensor piezoelectric sheet 63 is compressed in the thickness direction. As a result, polarization is generated in the sensor piezoelectric sheet 63 by a piezoelectric effect and a voltage is generated between the first sensor electrode sheet 61 and the second sensor electrode sheet 62. That is, the sensor 60 generates a voltage in accordance with the pressing force.

Here, the sensor 60 is formed of a soft material that has flexibility and is stretchable. Specifically, the first sensor electrode sheet 61 and the second sensor electrode sheet 62 are formed of the same material as that of the first electrode sheet 11 and the second electrode sheet 12 in the actuator 10. The sensor dielectric sheet 63 is formed as the same material as that of the dielectric sheet 13 in the actuator 10. The sensor piezoelectric sheet 63 is formed as the same material as that of the piezoelectric sheet 13 in the actuator 10. The first sensor protective sheet 64 and the second sensor protective sheet 65 are formed of the same material as that of the first protective sheet 14 and the second protective sheet 15. That is, an elastic modulus $E_{(60)}$ and a loss factor tan $\delta_{(60)}$ of the sensor 60 are the same as the elastic modulus $E_{(16)}$ and the loss factor tan $\delta_{(16)}$ of the actuator main body 16.

The cover 70 surrounds the actuator 10, the first conductive part 20, the second conductive part 30, the first elastic body 40, the second elastic body 50, and the sensor 60. For example, any of various materials such as a metal and a resin is applied to the cover 70. When a pressing force in the laminate direction of the actuator laminate (10, 40, 50) is applied from the outside, the cover 70 transmits the pressing force to the sensor 60. Further, the cover 70 vibrates with the vibration generated by the actuator 10 and applies the vibration to a human finger that has applied the pressing force to the cover 70.

The cover 70 includes a first cover 71 serving as a pedestal and a second cover 72 serving as a member which is attached to the first cover 71 and to which a pressing force is applied. The first cover 71 and the second cover 72 holds the actuator main body 16, the first elastic body 40, the second elastic body 50, and the sensor 60 such that the actuator main body 16, the first elastic body 40, the second elastic body 50, and the sensor 60 are compressed in the laminate direction (the vertical direction of FIGS. 1 and 2) of the actuator laminate (10, 40, 50). In this state, in view of the relation between the elastic moduli E of the members, the first elastic body 40 and the second elastic body 50 are compressed more than the actuator main body 16 and the sensor 60 in the laminate direction of the actuator laminate (10, 40, 50).

The first cover 71 holds the actuator main body 16 and the first elastic body 40 such that the actuator main body 16 and the first elastic body 40 are compressed in the planar direction (the right and left directions of FIG. 2) of the actuator main body 16. In this state, in view of the relation between the elastic moduli E of the members, the first elastic body 40 is compressed more than the actuator main body 16 in the planar direction of the actuator main body 16.

Figure 5:
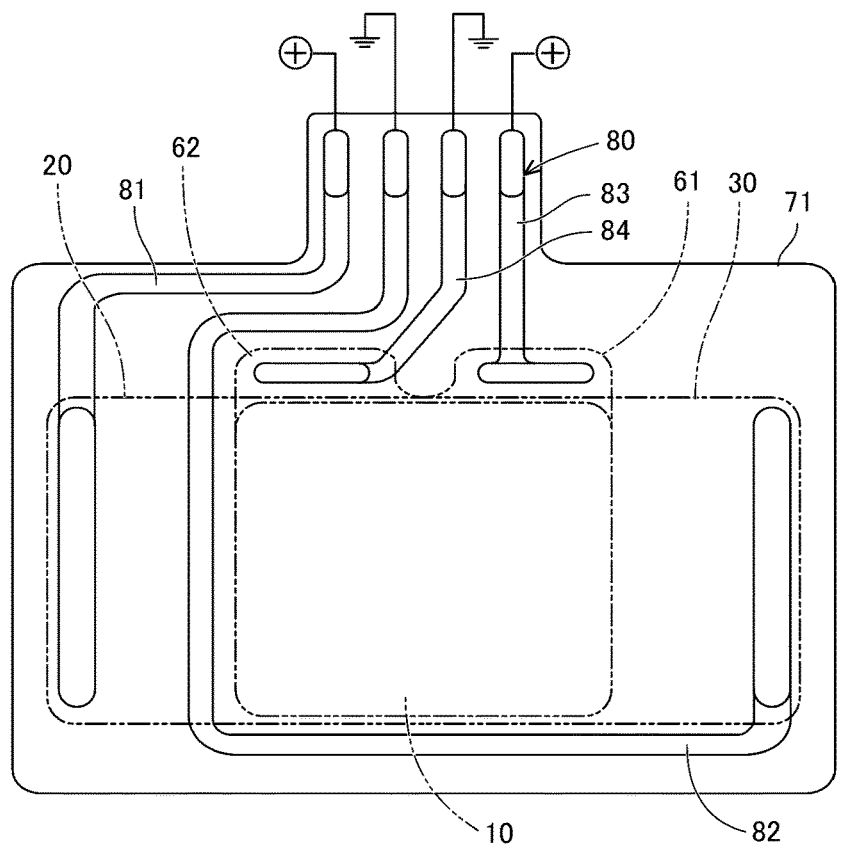
FIG. 5 is a diagram illustrating a layout of each conductive wire disposed on the upper surface of a first cover 71.

The conductive wire 80 is disposed on the same planar surface as that of the first cover 71 located on the inner surface of the cover 70. In the embodiment, the conductive wire 80 is formed on the first cover 71 by printing, but can also be formed using a cable or the like. As illustrated in FIG. 5, the conductive wire 80 is extended from a region in which there are the actuator 10, the first conductive part 20, the second conducive part 30, the first elastic body 40, the second elastic body 50, and the sensor 60 and from the same edge in the periphery centering on the laminate direction to the outside (the upper side of FIG. 5) of the second cover 72.

The conductive wire 80 includes an actuator positive conductive wire 81, an actuator ground conductive wire 82, a sensor positive conductive wire 83, and a sensor ground conductive wire 84. One end of the actuator positive conductive wire 81, one end of actuator ground conductive wire 82, one end of the sensor positive conductive wire 83, and one end of the sensor ground conductive wire 84 are located at a common external extension position of the first cover 71 to be able to be connected to an external connector (not illustrated) or the like.

The actuator positive conductive wire 81 is conducted to the first electrode sheet 11 via the first conductive part 20. That is, the other end of the actuator positive conductive wire 81 comes into contact with the other side of the L shape of the first conductive part 20. The one side of the L shape of the first conductive part 20 is electrically connected to the ends of the plurality of first terminal electrode parts 11b.

The actuator ground conductive wire 82 is conducted to the second electrode sheet 12 via the second conductive part 30. That is, the other end of the actuator ground conductive wire 82 comes into contact with the other side of the L shape of the second conductive part 30. The one side of the L shape of the second conductive part 30 is electrically connected to the ends of the plurality of second terminal electrode parts 12c. Further, the actuator ground conductive wire 82 is laid to circle along the edge of the sensor 60. That is, the actuator ground conductive wire 82 is laid to pass between the sensor 60 and the actuator positive conductive wire 81.

The sensor positive conductive wire 83 is conducted to the first sensor electrode sheet 61 serving as the positive electrode of the sensor 60. That is, the other end of the sensor positive conductive wire 83 is connected to the first sensor electrode sheet 61. The sensor ground conductive wire 84 is connected to the second sensor electrode sheet 62 serving as a ground electrode of the sensor 60. That is, the other end of the sensor ground conductive wire 84 is connected to the second sensor electrode sheet 62. Further, the sensor ground conductive wire 84 is laid to pass between the sensor positive conductive wire 83 and the actuator ground conductive wire 82.

That is, the actuator ground conductive wire 82 and the sensor ground conductive wire 84 are laid to be located between the actuator positive conductive wire 81 and the sensor positive conductive wire 83 at the common external extension position of the first cover 71. Accordingly, parasitic capacitance or the like between the actuator positive conductive wire 81 and the sensor positive conductive wire 83 decreases. Further, the actuator ground conductive wire 82 circles along the edge of the sensor 60 on the inner side of the actuator positive conductive wire 81. Accordingly, parasitic capacitance between the actuator positive conductive wire 81 and the sensor 60 decreases.

The control device 90 drives the actuator 10 to generate vibration when the sensor 60 detects a pressing force applied to the cover 70. The control device 90 is disposed outside of the cover 70, but may be disposed inside the cover 70.

1-3. Configuration of Control Device 90

Figure 6:
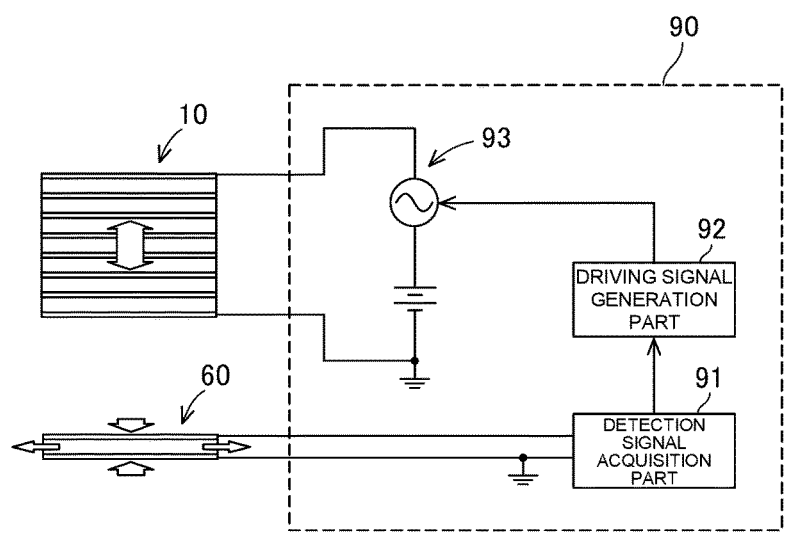
FIG. 6 is a conceptual diagram illustrating an electric connection state of the vibration presentation device 1.

A configuration of the control device 90 will be described with reference to FIG. 6. The control device 90 includes a detection signal acquisition part 91, a driving signal generation part 92, and a driving circuit 93. The detection signal acquisition part 91 is connected to the sensor positive conductive wire 83 and the sensor ground conductive wire 84. That is, the detection signal acquisition part 91 is electrically connected to the first sensor electrode sheet 61 and the second sensor electrode sheet 62.

When the sensor 60 is of an electrostatic type, electrostatic capacitance between the first sensor electrode sheet 61 and the second sensor electrode sheet 62 is electrostatic capacitance in accordance with a pressing force applied to the cover 70. Accordingly, the detection signal acquisition part 91 can acquire a voltage in accordance with electrostatic capacitance between the electrodes by applying a predetermined alternating-current voltage to the sensor 60. Then, when a pressing force is applied to the cover 70 by the sensor 60, the detection signal acquisition part 91 acquires the applied pressing force.

When the sensor 60 is of a piezoelectric type, a voltage in accordance with a pressing force applied to the cover 70 is generated between the first sensor electrode sheet 61 and the second sensor electrode sheet 62. Accordingly, the detection signal acquisition part 91 can acquire a voltage generated between the first sensor electrode sheet 61 and the second sensor electrode sheet 62. That is, when a pressing force is applied to the cover 70 by the sensor 60, the detection signal acquisition part 91 acquires the applied pressing force.

The driving signal generation part 92 generates a driving signal (an actuator signal) of the actuator 10 when the detection signal acquisition part 91 acquires a detection signal output from the sensor 60. The driving signal generation part 92 stores one kind of driving signal in advance and outputs the one driving signal to the driving circuit 93 when the detection signal acquisition part 91 acquires the detection signal. The driving circuit 93 applies a periodic voltage to the first electrode sheet 11 and the second electrode sheet 12 of the actuator 10 based on the driving signal generated by the driving signal generation part 92. Accordingly, the actuator 10 generates one kind of vibration.

1-4. Vibration Presentation Operation by Vibration Presentation Device 1

A vibration presentation operation by the vibration presentation device 1 will be described. A periodic voltage by the driving circuit 93 is applied to the first counter electrode part 11a and the second counter electrode part 12a via the first terminal electrode part 11b and the second terminal electrode part 12c. Here, the periodic voltage may be an alternating-current voltage (a periodic voltage including positive and negative poles) or may be a periodic voltage offset to a positive value.

When the actuator 10 is of an electrostatic type, the actuator 10 operates as follows. When charges accumulated in the first counter electrode part 11a and the second counter electrode part 12a increase, the dielectric main body 13a is compressed and deformed. That is, the thickness of the actuator main body 16 decreases and the size (the width and depth) of the actuator main body 16 in the planar direction increases. Conversely, when charges accumulated in the first counter electrode part 11a and the second counter electrode part 12a decrease, the dielectric main body 13a returns to the original thickness. That is, the thickness of the actuator main body 16 increases and the size of the actuator main body 16 in the planar direction decreases. In this way, the actuator main body 16 stretches in the laminate direction and stretches in the planar direction.

When the actuator 10 is of a piezoelectric type and a voltage is applied to the first counter electrode part 11a and the second counter electrode part 12a, the piezoelectric main body 13a is decompressed and deformed. Conversely, when the voltage applied to the first counter electrode part 11a and the second counter electrode part 12a decrease, the piezoelectric main body 13a returns to the original thickness. That is, as in the electrostatic type, the actuator main body 16 stretches in the laminate direction and stretches in the planar direction.

When the actuator main body 16 performs a stretching operation, the vibration presentation device 1 operates as follows. As illustrated in FIG. 1, the vibration presentation device 1 sets the state in which the first elastic body 40 and the second elastic body 50 are compressed as an initial state. Accordingly, when the thickness of the actuator main body 16 decreases, the first elastic body 40 and the second elastic body 50 are deformed such that a compression amount decreases more than in the initial state. Conversely, when the thickness of the actuator main body 16 increases, the first elastic body 40 and the second elastic body 50 operate to return to the initial state.

Since the application voltage varies periodically, the foregoing operation is repeated. Then, a state in which the middle of the actuator main body 16 is recessed on the side of the second elastic body 50 and a state in which the middle of the actuator main body 16 is bulged on the side of the second elastic body 50 are repeated. Since the actuator main body 16 is regulated by the cover 70 via the first elastic body 40 and the second elastic body 50, the foregoing operation is realized.

With the deformation operation of the actuator main body 16, the displacement in the laminate direction of the actuator main body 16 (the same direction as an electric field of a direction d33) is transmitted to the cover 70 via the first elastic body 40. Further, an elastic deformation force of the first elastic body 40 is changed by the stretching operation of the actuator main body 16. A change in the elastic deformation force of the first elastic body 40 is transmitted to the cover 70. Accordingly, the first elastic body 40 and the second elastic body 50 are compressed in the initial state, and thus vibration in the laminate direction (the direction d33) of the actuator main body 16 can efficiently be applied to the cover 70. That is, even when slight vibration is generated in the single actuator main body 16, large vibration can be applied to the cover 70.

Further, with the deformation operation of the actuator main body 16, displacement in the planar direction (a direction d31: a direction orthogonal to an electric field) of the actuator main body 16 is transmitted to the cover 70 via the first elastic body 40. As a result, vibration in the planar direction (the direction d31) of the actuator main body 16 is applied to the cover 70. Here, the vibration in the planar direction (the direction d31) of the actuator main body 16 is less than vibration in the laminate direction (a direction d33). However, the vibration in the planar direction (the direction d31) is added to the vibration in the laminate direction (the direction d33) of the actuator main body 16, and thus large vibration can be applied to the overall cover 70.

Here, when the loss factors $\tan \delta_{(40)}$ and $\tan \delta_{(50)}$ of the first elastic body 40 and the second elastic body 50 are considerably large, the vibration is absorbed by the first elastic body 40 and the second elastic body 50 despite the stretching operation performed by the actuator main body 16. In this case, even when the actuator main body 16 performs the stretching operation, no vibration is delivered to the cover 70.

However, in the embodiment, materials that have small loss factors $\tan \delta_{(40)}$ and $\tan \delta_{(50)}$ are used for the first elastic body 40 and the second elastic body 50. Accordingly, the vibration by the stretching operation of the actuator main body 16 is transmitted to the cover 70 without almost being absorbed by the first elastic body 40 and the second elastic body 50.

Further, the elastic moduli $E_{(40)}$ and $E_{(50)}$ of the first elastic body 40 and the second elastic body 50 are less than the elastic modulus $E1_{(16)}$ in the laminate direction of the actuator main body 16. Therefore, in the initial state in which no voltage is applied to the first counter electrode part 11a and the second counter electrode part 12a, the actuator main body 16 is not almost compressed. Accordingly, even when the cover 70 compresses the actuator main body 16 in the laminate direction, there is no influence on the stretching operation in the laminate direction of the actuator main body 16. That is, the actuator main body 16 can reliably perform the stretching operation.

The elastic modulus $E_{(40)}$ of the first elastic body 40 is less than the elastic modulus $E2_{(16)}$ in the planar direction of the actuator main body 16. Therefore, in the initial state in which no voltage is applied to the first counter electrode part 11a and the second counter electrode part 12a, the actuator main body 16 is not almost compressed. Accordingly, even when the cover 70 compresses the actuator main body 16 in the planar direction, there is no influence on the stretching operation in the planar direction of the actuator main body 16. That is, the actuator main body 16 can reliably perform the stretching operation.

In the foregoing embodiment, the first elastic body 40 may be disposed only on an end surface in the plane-orthogonal direction of the actuator main body 16. In this case, the first elastic body 40 is not disposed on the end surface in the planar direction of the actuator main body 16. Accordingly, the vibration presentation device 1 does not apply the vibration in the planar direction (the direction d31) of the actuator main body 16 to the cover 70.

1-5. Advantageous Effect

The vibration presentation device 1 includes the sensor 60 and the control device 90, as described above. The sensor 60 is disposed around the actuator 10 inside the cover 70 and detects a pressing force applied to the cover 70. Then, the control device 90 drives the actuator 10 when the sensor 60 detects that a pressing force is applied. For example, when a pressing force is applied to the cover 70 by a human finger, the sensor 60 detects the pressing force and the actuator 10 is subsequently driven. Then, vibration can be presented to the human finger which has applied the pressing force to the cover 70. That is, the sensor 60 and the actuator 10 are disposed inside the cover 70 and the sensor 60 is disposed around the actuator 10, and thus responsiveness from the detection of the pressing force to the presentation of the vibration is considerably satisfactory. Accordingly, the vibration presentation device 1 includes the actuator 10 and the sensor 60 detecting the pressing force, and thus can present large vibration without an increase in size.

Further, the actuator 10 and the sensor 60 are laminated in a direction in which the pressing force is applied. Accordingly, a position at which the pressing force is detected is the same as a position at which the vibration is applied. Accordingly, when a human finger applies a pressing force to the cover 70, vibration can be directly applied to the finger.

1-6. Modifications of First Embodiment

When the sensor 60 detects a pressing force, the control device 90 may generate a signal for driving the actuator 10 in accordance with the magnitude of the pressing force detected by the sensor 60 and drive the actuator 10 based on the generated signal for driving the actuator 10. In this case, when the detection signal acquisition part 91 of the control device 90 acquires a detection signal, the driving signal generation part 92 generates a driving signal in accordance with the magnitude of the detection signal. For example, when a pressing force is large, the detection signal by the detection signal acquisition part 91 increases and the driving signal generated by the driving signal generation part 92 increases as well. That is, as the pressing force increases, the magnitude of vibration generated by the actuator 10 increases.

In addition to the above, the driving signal generation part 92 stores driving signals with pluralities of different periods and magnitudes in advance and associate the plurality of kinds of driving signals with the magnitude of pressing forces. In this case, when the detection signal acquisition part 91 acquires a detection signal, the driving signal generation part 92 decides (generates) driving vibration of a period and magnitude in accordance with the magnitude of the detection signal. Then, the actuator 10 generates vibration with the period and magnitude in accordance with the driving signal.

In this way, when the actuator 10 generates vibration in accordance with the magnitude of a pressing force, a person applying a pressing force to the cover 70 can ascertain the degree of applied pressing force.

2. Second Embodiment

A vibration presentation device 100 according to a second embodiment will be described with reference to FIGS. 7 and 8. The vibration presentation device 100 further includes a third elastic body 101 in the configuration of the vibration presentation device 1 of the first embodiment.

The third elastic body 101 is laminated on the actuator laminate (10, 40, 50) and the sensor 160 and is disposed on the sensor 160 on the opposite side to the actuator laminate (10, 40, 50). The third elastic body 101 is formed of the same material as the first elastic body 40 and the second elastic body 50. Accordingly, an elastic modulus $E_{(101)}$ and a loss factor $\tan \delta_{(101)}$ of the third elastic body 101 are the same as the elastic modulus $E_{(40)}$ and the loss factor $\tan \delta_{(40)}$ of the first elastic body 40 and the elastic modulus $E_{(50)}$ and the loss factor $\tan \delta_{(50)}$ of the second elastic body 50.

Figure 7:
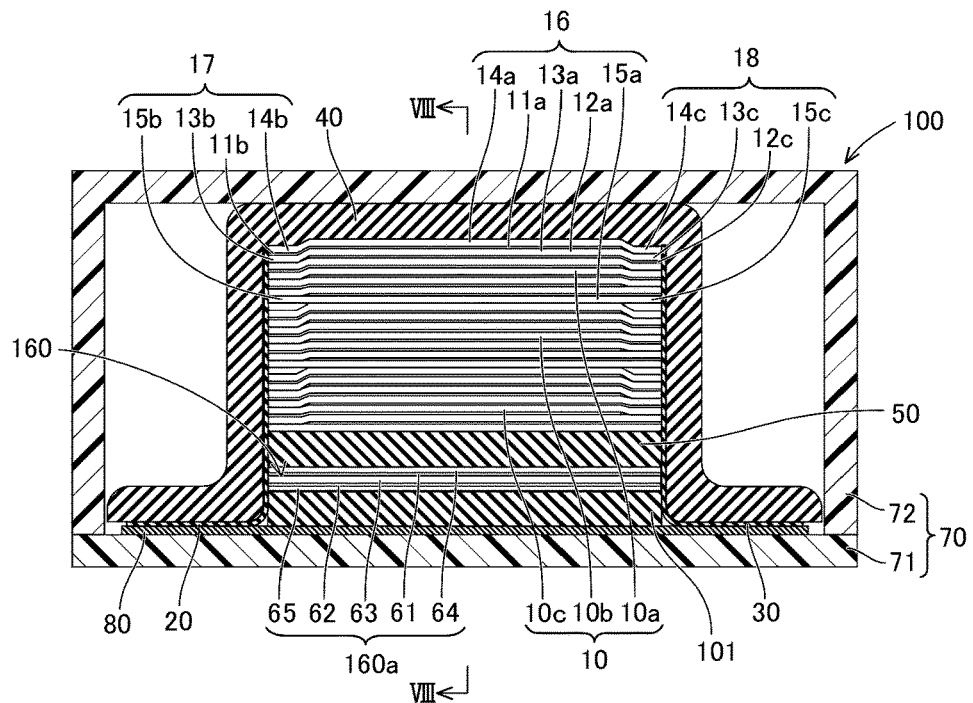
FIG. 7 is a sectional view illustrating a vibration presentation device 100 according to a second embodiment.
Figure 8:
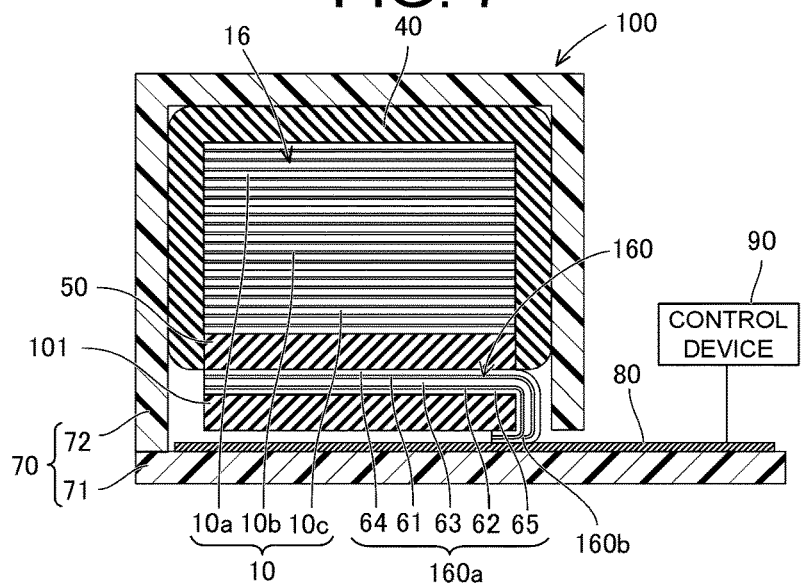
FIG. 8 is a sectional view taken along the line VIII-VIII of FIG. 7.

As illustrated in FIG. 7, the sensor 160 includes the first sensor electrode sheet 61, the second sensor electrode sheet 62, the sensor dielectric sheet 63 or the sensor piezoelectric sheet 63, the first sensor protective sheet 64, and the second sensor protective sheet 65. As illustrated in FIG. 8, the sensor 160 includes a sensor main body part 160a that is disposed between the actuator laminate (10, 40, 50) and the third elastic body 101 and a sensor terminal part 160b that extends from the sensor main body part 160a and is formed to be bent to surround the third elastic body 101 on the opposite side (the lower side of FIG. 8) to the sensor main body part 160a. The sensor terminal part 160b is located between the third elastic body 101 and the conductive wire 80 and is connected to the sensor positive conductive wire 83 (illustrated in FIG. 5) and the sensor ground conductive wire 84 (illustrated in FIG. 5) of the conductive wire 80.

The sensor terminal part 160b is formed to be bent at a different position from the first conductive part 20 and the second conductive part 30 on the outer circumference of the third elastic body 101. That is, the sensor terminal part 160b is connected to the sensor positive conductive wire 83 and the sensor ground conductive wire 84 without being electrically connected to the first conductive part 20 and the second conductive part 30.

Further, the cover 70 holds the third elastic body 101 such that the third elastic body 101 is compressed more than the sensor 160. Here, as illustrated in FIG. 8, the third elastic body 101 and the first cover 71 that do not come into contact with each other are illustrated due to presence of the sensor terminal part 160b. Actually, since the sensor terminal part 160b is thin, the third elastic body 101 and the first cover 71 come into contact with each other in the compressed state. Accordingly, the sensor 160 is interposed between the second elastic body 50 and the third elastic body 101. The second elastic body 50 and the third elastic body 101 do not regulate a stretching operation of the sensor 160. Therefore, sensitivity of the sensor 160 to a pressing force applied to the cover 70 is amplified. Accordingly, even when a pressing force to be applied is slight, the sensor 160 can detect the pressing force.

3. Third Embodiment

Figure 9:
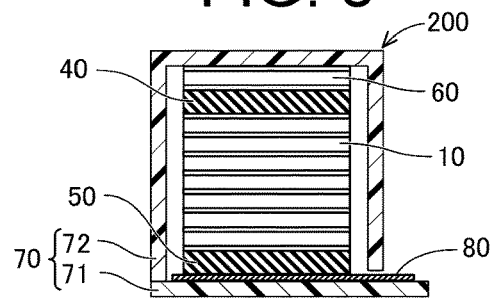
FIG. 9 is a schematic view illustrating a vibration presentation device 200 according to a third embodiment.

A vibration presentation device 200 according to a third embodiment will be described with reference to FIG. 9. In the vibration presentation device 200, the sensor 60 is disposed on the side of the second cover 72 serving as a member to which a pressing force is applied in the cover 70 with regard to the actuator laminate (10, 40, 50) in the laminate direction of the actuator laminate (10, 40, 50). In this case, a conductive member may be provided to conduct the first sensor electrode sheet 61, and the second sensor electrode sheet 62 of the sensor 60, and the conductive wire 80.

4. Fourth Embodiment

Figure 10:
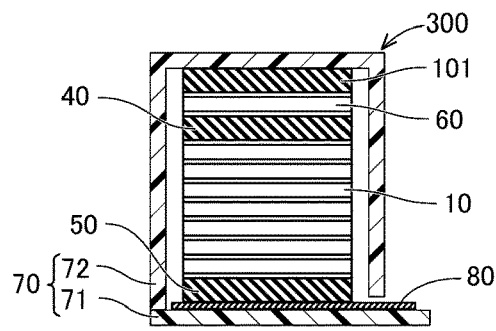
FIG. 10 is a schematic view illustrating a vibration presentation device 300 according to a fourth embodiment.

A vibration presentation device 300 according to a fourth embodiment will be described with reference to FIG. 10. In the vibration presentation device 300, the sensor 60 is disposed on the surface on the side of the second cover 72 serving as a member to which a pressing force is applied in the cover 70 with regard to the actuator laminate (10, 40, 50) in the laminate direction of the actuator laminate (10, 40, 50). Further, the third elastic body 101 is disposed on a surface on the side of the second cover 72 serving as a member to which a pressing force is applied in the cover 70 with regard to the sensor 60 in the laminate direction of the actuator laminate (10, 40, 50).

5. Fifth Embodiment

Figure 11:
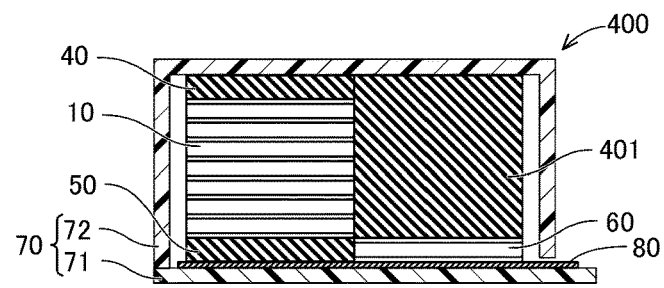
FIG. 11 is a schematic view illustrating a vibration presentation device 400 according to a fifth embodiment.

A vibration presentation device 400 according to a fifth embodiment will be described with reference to FIG. 11. The vibration presentation device 400 further includes a fourth elastic body 401 laminated on the sensor 60. The fourth elastic body 401 is formed of the same material as the first elastic body 40. Accordingly, an elastic modulus $E_{(401)}$ and a loss factor tan $\delta_{(401)}$ of the fourth elastic body 401 are the same as the elastic modulus $E_{(40)}$ and the loss factor tan $\delta_{(40)}$ of the first elastic body 40.

A sensor laminate (60, 401) formed by the sensor 60 and the fourth elastic body 401 is disposed in parallel to the actuator laminate (10, 40, 50) in a direction orthogonal to the laminate direction of the actuator laminate (10, 40, 50). The cover 70 holds the fourth elastic body 401 such that the fourth elastic body 401 is compressed more than the sensor 60. An operation of the vibration presentation device 400 is substantially similar to that of the vibration presentation device 1 of the first embodiment. The sensor 60 is disposed on the side of the first cover 71 of the fourth elastic body 401, but may be disposed on the side of the second cover 72.

6. Sixth Embodiment

Figure 12:
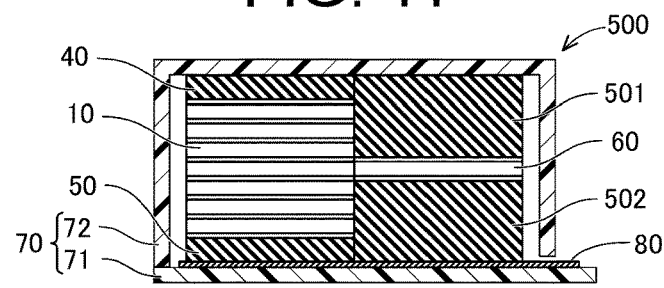
FIG. 12 is a schematic view illustrating a vibration presentation device 500 according to a sixth embodiment.

A vibration presentation device 500 according to a sixth embodiment will be described with reference to FIG. 12. The vibration presentation device 500 further includes a fourth elastic body 501 laminated on the sensor 60 and a fifth elastic body 502 laminated on the sensor 60 on the opposite side to the fourth elastic body 501. The fourth elastic body 501 and the fifth elastic body 502 are formed of the same material as the first elastic body 40. Accordingly, an elastic modulus $E_{(501)}$ and a loss factor tan $\delta_{(501)}$ of the fourth elastic body 501 and an elastic modulus $E_{(502)}$ and a loss factor tan $\delta_{(502)}$ of the fifth elastic body 502 are the same as the elastic modulus $E_{(40)}$ and the loss factor tan $\delta_{(40)}$ of the first elastic body 40.

A sensor laminate (60, 501, 502) formed by the sensor 60, the fourth elastic body 501, and the fifth elastic body 502 is disposed in parallel to the actuator laminate (10, 40, 50) in a direction orthogonal to the laminate direction of the actuator laminate (10, 40, 50). The cover 70 holds the fourth elastic body 501 and the fifth elastic body 502 such that the fourth elastic body 501 and the fifth elastic body 502 are compressed more than the sensor 60. An operation of the vibration presentation device 500 is substantially similar to that of the vibration presentation device 1 of the first embodiment.

7. Seventh Embodiment

Figure 13:
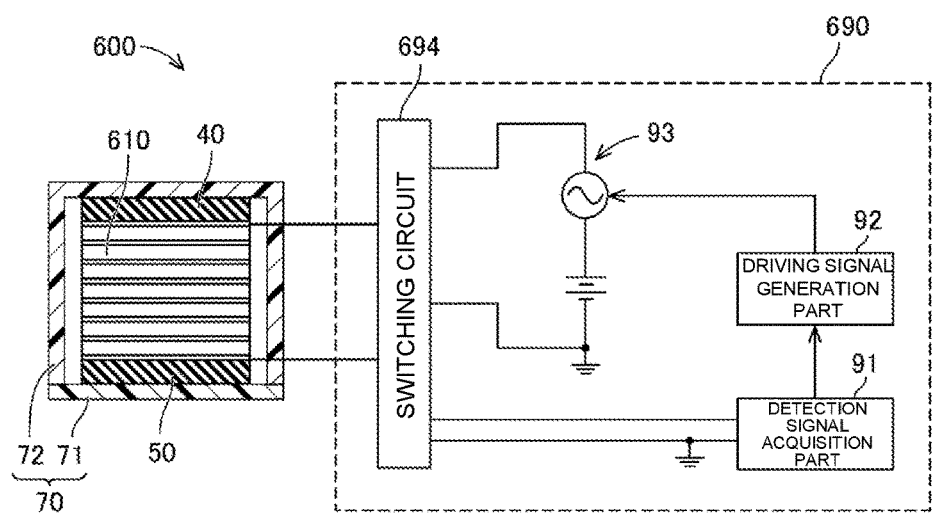
FIG. 13 is a schematic view illustrating a vibration presentation device 600 according to a seventh embodiment.

A vibration presentation device 600 according to a seventh embodiment will be described with reference to FIG. 13. The vibration presentation device 600 includes a transducer 610, the first conductive part 20 (illustrated in FIG. 1), the second conductive part 30 (illustrated in FIG. 1), the first elastic body 40, the second elastic body 50, the cover 70, the conductive wire 80, and a control device 690.

The transducer 610 has the same configuration as the actuator 10 of the first embodiment. The transducer 610 functions as a sensor and functions as an actuator. The transducer 610 may be an electrostatic transducer or may be a piezoelectric transducer. That is, the transducer 610 includes the first electrode sheet 11, the second electrode sheet 12, the dielectric sheet 13 or the piezoelectric sheet 13, the first protective sheet 14, and the second protective sheet 15.

The first elastic body 40 is laminated on the transducer 610 and the second elastic body 50 is laminated on the transducer 610 on the opposite side to the first elastic body 40. The cover 70 holds a transducer laminate (610, 40, 50) formed by the transducer 610, the first elastic body 40, the second elastic body 50 such that the transducer laminate (610, 40, 50) is compressed in the laminate direction and the first elastic body 40 and the second elastic body 50 are compressed more than the transducer 610. Further, when a pressing force in the laminate direction is applied to the cover 70 from the outside, the cover 70 transmits the pressing force to the transducer 610.

The control device 690 drives the transducer 610 as an actuator to transmit vibration to the cover 70 after the transducer 610 detects a pressing force as a sensor. The control device 690 includes the detection signal acquisition part 91, the driving signal generation part 92, the driving circuit 93, and a switching circuit 694. The detection signal acquisition part 91, the driving signal generation part 92, and the driving circuit 93 have a similar configuration to that of the control device 90 of the first embodiment.

Here, when the transducer 610 functions as a sensor, the switching circuit 694 causes the detection signal acquisition part 91 to acquire a detection signal of the transducer 610. On the other hand, when the transducer 610 functions as an actuator, the switching circuit 694 causes the driving circuit 93 to cause the transducer 610 to generate vibration. That is, the switching circuit 694 switches the transducer 610 between the state in which the transducer 610 functions as the sensor and the state in which the transducer 610 functions as the actuator.

As described above, in the state in which the transducer laminate (610, 40, 50) is compressed by the cover 70, the first elastic body 40 and the second elastic body 50 disposed on both sides of the transducer 610 are compressed more than the transducer 610. Therefore, even when the transducer laminate (610, 40, 50) is compressed by the cover 70, there is no influence on a stretching operation of the transducer 610.

Then, when a voltage is applied to the first electrode sheet 11 and the second electrode sheet 12 of the transducer 610, the transducer 610 functions as the actuator and stretches in the thickness direction. Displacement of the transducer 610 generated through the stretching operation of the transducer 610 is transmitted to the cover 70 via the first elastic body 40 or the second elastic body 50. Further, an elastic deformation force of the first elastic body 40 and the second elastic body 50 is changed through the stretching operation of the transducer 610 and the change in the elastic deformation force of the first elastic body 40 and the second elastic body 50 is transmitted to the cover 70. Accordingly, in an initial state, the first elastic body 40 and the second elastic body 50 are compressed by the cover 70, and thus vibration is efficiently applied to the cover 70. That is, even when slight vibration is generated in the single transducer 610, large vibration can be applied to the cover 70.

The transducer 610 functions as an actuator and functions as a sensor. The transducer 610 is disposed inside the cover 70 and detects a pressing force applied to the cover 70.

Further, when the transducer 610 serving as the sensor detects that the pressing force is applied, the control device 690 of the vibration presentation device 600 drives the transducer 610 serving as the actuator. For example, when a pressing force is applied to the cover 70 by a human finger, the transducer 610 serving as the sensor detects the pressing force and the transducer 610 serving as the actuator is subsequently driven. Then, vibration can be presented to the human finger which has applied the pressing force to the cover 70. That is, the transducer 610 serves as both the sensor and the actuator and is disposed inside the cover 70, and thus responsiveness from the detection of the pressing force to the presentation of the vibration is considerably satisfactory. Accordingly, the vibration presentation device 600 includes the actuator and the sensor detecting the pressing force, and thus can present large vibration without an increase in size.

What is claimed is:

1. A vibration presentation device comprising:
    an electrostatic or piezoelectric actuator that includes a first electrode sheet, a second electrode sheet, and a dielectric sheet or a piezoelectric sheet disposed between the first electrode sheet and the second electrode sheet;
    a first elastic body laminated on the actuator;
    a second elastic body laminated on the actuator on an opposite side to the first elastic body;
    an electrostatic or piezoelectric sensor disposed around the actuator;
    a cover that holds the first elastic body and the second elastic body such that an actuator laminate formed by the actuator, the first elastic body, and the second elastic body is compressed in a laminate direction and the first elastic body and the second elastic body are compressed more than the actuator and that transmits, when a pressing pressure in the laminate direction is applied to the cover from the outside, the pressing force to the sensor and vibrates by vibration generated by the actuator; and
    a control device that drives the actuator when the sensor detects the pressing force.

2. The vibration presentation device according to claim 1, wherein the sensor is laminated on the actuator laminate.

3. The vibration presentation device according to claim 2, further comprising:
    a third elastic body that is laminated on the actuator laminate and the sensor and is disposed on the sensor on an opposite side to the actuator laminate,
    wherein the cover holds the third elastic body such that the third elastic body is compressed more than the sensor.

4. The vibration presentation device according to claim 3, wherein the first elastic body, the second elastic body, and the third elastic body are formed of the same material.

5. The vibration presentation device according to claim 1, further comprising:
    a fourth elastic body that is laminated on the sensor,
    wherein a sensor laminate formed by the sensor and the fourth elastic body is disposed in parallel to the actuator laminate in a direction orthogonal to the laminate direction of the actuator, and
    wherein the cover holds the fourth elastic body such that the fourth elastic body is compressed more than the sensor.

6. The vibration presentation device according to claim 5, further comprising:
    a fifth elastic body that is laminated on the sensor on an opposite side to the fourth elastic body,
    wherein the sensor laminate formed by the sensor, the fourth elastic body, and the fifth elastic body is disposed in parallel to the actuator laminate in a direction orthogonal to the laminate direction, and
    wherein the cover holds the fourth elastic body and the fifth elastic body such that the fourth elastic body and the fifth elastic body are compressed more than the sensor.

7. The vibration presentation device according to claim 5, wherein the first elastic body, the second elastic body, and the fourth elastic body are formed of the same material.

8. The vibration presentation device according to claim 1,
    wherein the actuator includes a plurality of the first electrode sheets, a plurality of the second electrode sheets, and a plurality of the dielectric sheets or a plurality of the piezoelectric sheets,
    wherein the first electrode sheet includes a first counter electrode part and a first terminal electrode part extending from the first counter electrode part,
    wherein the second electrode sheet includes a second counter electrode part facing the first counter electrode part and a second terminal electrode part extending from the second counter electrode part, and
    wherein the dielectric sheet or the piezoelectric sheet includes
    a dielectric main body or a piezoelectric main body that is interposed between the first counter electrode part and the second counter electrode part,
    a first extension part that extends from the dielectric main body or the piezoelectric main body and is interposed between the plurality of first terminal electrode parts, and a second extension part that extends from the dielectric main body or the piezoelectric main body and is interposed between the plurality of second terminal electrode parts.

9. The vibration presentation device according to claim 8, further comprising:
a first conductive part that comes into contact with an end of the first terminal electrode part and an end of the first extension part and is electrically connected to ends of the plurality of first terminal electrode parts, and
a second conductive part that comes into contact with an end of the second terminal electrode part and an end of the second extension part and is electrically connected to ends of the plurality of second terminal electrode parts.

10. The vibration presentation device according to claim 3, wherein the sensor includes
a sensor main body part that is disposed between the actuator laminate and the third elastic body; and
a sensor terminal part that extends from the sensor main body part and is formed to be bent to surround the third elastic body on an opposite side to the sensor main body part.

11. The vibration presentation device according to claim 1,
wherein the vibration presentation device includes, on the same plane of an inner surface of the cover,
an actuator positive conductive wire that is electrically connected to the first electrode sheet,
an actuator ground conductive wire that is electrically connected to the second electrode sheet,
a sensor positive conductive wire that is electrically connected to a positive electrode of the sensor, and
a sensor ground conductive wire that is electrically connected to a ground electrode of the sensor,
wherein the actuator positive conductive wire, the actuator ground conductive wire, the sensor positive conductive wire, and the sensor ground conductive wire are extended from the same edge in a periphery centering on the laminate direction to the outside, and
wherein the actuator ground conductive wire and the sensor ground conductive wire are laid to be located between the actuator positive conductive wire and the sensor positive conductive wire at an extended position.

12. The vibration presentation device according to claim 1, wherein, when the sensor detects the pressing force, the control device generates an actuator signal in accordance with magnitude of the pressing force detected by the sensor and drives the actuator based on the actuator signal being generated.

13. A vibration presentation device comprising:
an electrostatic or piezoelectric transducer that includes a first electrode sheet, a second electrode sheet, and a dielectric sheet or a piezoelectric sheet disposed between the first electrode sheet and the second electrode sheet and functions as a sensor and an actuator;
a first elastic body laminated on the transducer;
a second elastic body laminated on the transducer on an opposite side to the first elastic body;
a cover that holds the first elastic body and the second elastic body such that a transducer laminate formed by the transducer, the first elastic body, and the second elastic body is compressed in a laminate direction and the first elastic body and the second elastic body are compressed more than the transducer and that transmits, when a pressing pressure in the laminate direction is applied to the cover from the outside, the pressing force to the transducer; and
a control device that drives the transducer as the actuator and transmits vibration to the cover after the transducer serving as the sensor detects the pressing force.

* * * * *